(12) United States Patent
Kim

(10) Patent No.: US 8,817,567 B2
(45) Date of Patent: Aug. 26, 2014

(54) SEMICONDUCTOR MEMORY DEVICE HAVING LOW POWER MODE AND RELATED METHOD OF OPERATION

(75) Inventor: Kwant-Il Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 13/438,168

(22) Filed: Apr. 3, 2012

(65) Prior Publication Data

US 2012/0266002 A1 Oct. 18, 2012

(30) Foreign Application Priority Data

Apr. 18, 2011 (KR) .................. 10-2011-0035867

(51) Int. Cl.
G11C 7/00 (2006.01)
G11C 5/14 (2006.01)
(52) U.S. Cl.
CPC ...................................... G11C 5/147 (2013.01)
USPC ...................... 365/226; 365/230.03; 365/203
(58) Field of Classification Search
CPC ....... G11C 5/14; G11C 11/4074; G11C 5/147

USPC ..................................... 365/226, 230.06, 203
IPC ................................ G11C 5/14,11/4074, 5/147
See application file for complete search history.

(56) References Cited

U.S. PATENT DOCUMENTS

| 5,914,905 | A | 6/1999 | Hikichi et al. | |
|---|---|---|---|---|
| 6,307,771 | B1 * | 10/2001 | Schlager et al. | 365/145 |
| 7,167,407 | B2 | 1/2007 | Kyung et al. | |
| 7,453,758 | B2 * | 11/2008 | Hoffmann | 365/230.04 |
| 2002/0141228 | A1 * | 10/2002 | Fujino | 365/149 |
| 2003/0053329 | A1 * | 3/2003 | Chen | 365/149 |
| 2004/0085835 | A1 * | 5/2004 | Ahn et al. | 365/200 |
| 2010/0165713 | A1 | 7/2010 | Resta et al. | |

FOREIGN PATENT DOCUMENTS

JP 10144097 5/1998
KR 1020050069453 A 7/2005

* cited by examiner

Primary Examiner — Connie Yoha
(74) Attorney, Agent, or Firm — Volentine & Whitt, PLLC

(57) ABSTRACT

A semiconductor memory device has a normal power mode and a low power mode. In the low power mode, a selection circuit assigns one data address to at least two memory cells in the semiconductor memory device, and it reads or writes one unit of data from the at least two memory cells.

19 Claims, 11 Drawing Sheets

FIG. 8

| MEMORY ADDRESS | | | |
|---|---|---|---|
| $A_0$ | $A_1$ | $A_2$ | WORD LINE |
| 0 | 0 | 0 | $WL_0$ |
| 0 | 0 | 1 | $WL_1$ |
| 0 | 1 | 0 | $WL_2$ |
| 0 | 1 | 1 | $WL_3$ |
| 1 | 0 | 0 | $WL_4$ |
| 1 | 0 | 1 | $WL_5$ |
| 1 | 1 | 0 | $WL_6$ |
| 1 | 1 | 1 | $WL_7$ |

FIG. 9

| MEMORY ADDRESS | | | |
|---|---|---|---|
| $A_0$ | $A_1$ | $A_2$ | WORD LINE |
| X | 0 | 0 | $WL_0$ |
| X | 0 | 1 | $WL_1$ |
| X | 1 | 0 | $WL_2$ |
| X | 1 | 1 | $WL_3$ |
| X | 0 | 0 | $WL_4$ |
| X | 0 | 1 | $WL_5$ |
| X | 1 | 0 | $WL_6$ |
| X | 1 | 1 | $WL_7$ |

SEMICONDUCTOR MEMORY DEVICE HAVING LOW POWER MODE AND RELATED METHOD OF OPERATION

CROSS-REFERENCE TO RELATED APPLICATIONS

This application claims priority under 35 U.S.C. §119 to Korean Patent Application No. 10-2011-0035867 filed on Apr. 18, 2011, the subject matter of which is hereby incorporated by reference.

BACKGROUND OF THE INVENTION

The inventive concept relates generally to electronic data storage technologies. More particularly, the inventive concept relates to semiconductor memory devices having a low power operating mode.

There is an ever increasing demand for low power electronic devices and related components. This demand has arisen from a variety of factors, such as the proliferation of mobile devices with limited battery life, a need to reduce heat in certain applications, a general demand to conserve power, and many others.

Many efforts for reducing power consumption have focused on lowering the driving voltage of electronic devices. However, in certain devices, such as semiconductor memory devices, lowering the driving voltage can lead to unstable operation. For example, where a lowered driving voltage is used to input and output data from a memory cell in a semiconductor device, the operational stability of the semiconductor memory device may be degraded due to a lowered read margin.

SUMMARY OF THE INVENTION

In one embodiment of the inventive concept, a semiconductor memory device has a normal power mode and a low power mode and it is provided with a lower level of operating voltage in the low power mode than in the normal power mode. The semiconductor memory device comprises a memory cell array comprising a plurality of memory cells, and a selection circuit configured to assign one data address to at least two memory cells, and further configured to read one unit of data from the at least two memory cells in the low power mode.

In another embodiment of the inventive concept, a semiconductor memory device has a normal power mode and a low power mode and is provided with lower level of operating voltage in the low power mode than in the normal power mode. The semiconductor memory device comprises a memory cell array comprising a plurality of memory cells, a row decoder configured to enable first address lines corresponding to row addresses of the memory cells, a column decoder configured to enable second address lines corresponding to column addresses of the memory cells, and a sense amplifier unit configured to read data stored in the memory cells. At least one of the row decoder and the column decoder enables at least two address lines of the first and second address lines and assigns one data address to at least two memory cells of the memory cells in the low power mode.

In still another embodiment of the inventive concept, a method of operating a semiconductor memory device having a low power mode and a normal power mode comprises, in the low power mode, assigning a first data address to at least two memory cells and storing a first bit of data in each of the at least two memory cells, and in the normal power mode, assigning a second data address to only one memory cell and storing a second bit of data in the only one memory cell.

These and other embodiments of the inventive concept can potentially improve the reliability of semiconductor memory devices by improving their read margins during low power operation.

BRIEF DESCRIPTION OF THE DRAWINGS

The drawings illustrate selected embodiments of the inventive concept. In the drawings, like reference numbers indicate like features.

FIG. 8 is a table for explaining a row address used when the semiconductor memory device operates in the normal power mode.

FIG. 9 is a table for explaining a row address used when the semiconductor memory device operates in the low power mode.

DETAILED DESCRIPTION

Selected embodiments of the inventive concept are described below with reference to the accompanying drawings. These embodiments are presented as teaching examples and should not be construed to limit the scope of the inventive concept.

In the description that follows, the terms first, second, third, etc., may be used to describe various features, but these features should not be limited by these terms. Rather, these terms are used merely to distinguish one feature from another. Thus, a first feature discussed below could be termed a second feature without departing from the disclosed teachings. As used herein, the term "and/or" indicates any and all combinations of one or more of the associated listed items.

Where an element is referred to as being "connected" or "coupled" to another feature, it can be directly connected or coupled to the other feature or intervening features may be present. In contrast, where a feature is referred to as being "directly connected" or "directly coupled" to another feature, there are no intervening features present. Other words used to describe the relationship between features should be interpreted in a similar fashion (e.g., "between" versus "directly between," "adjacent" versus "directly adjacent," etc.).

The terminology used herein is for the purpose of describing example embodiments and is not intended to be limiting of the inventive concept. As used herein, the singular forms "a," "an" and "the" are intended to encompass the plural forms as well, unless the context clearly indicates otherwise. Terms such as "comprises", "comprising," "includes", and "including", when used in this specification, indicate the presence of stated features, but they do not preclude the presence of additional features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

Figure 1:
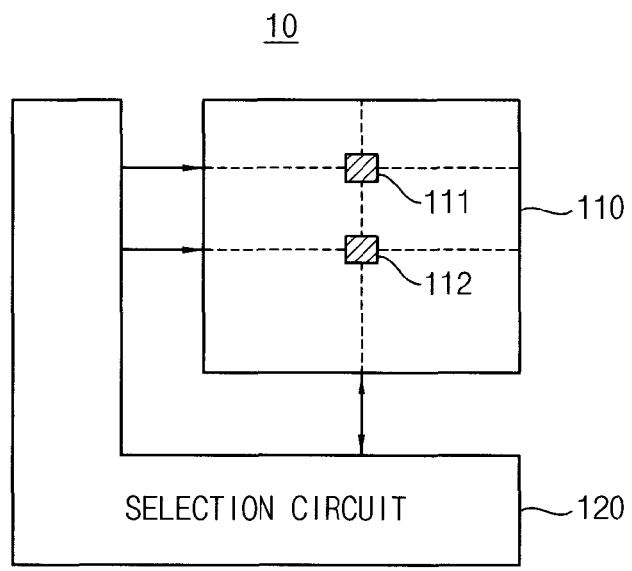
FIGS. 1 and 2 illustrate semiconductor memory devices according to embodiments of the inventive concept.
Figure 2:
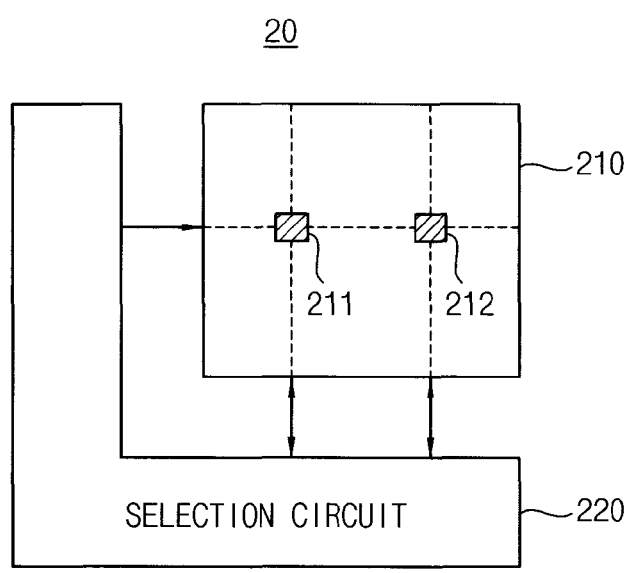

FIGS. 1 and 2 illustrate semiconductor memory devices according to embodiments of the inventive concept. These semiconductor memory devices can be, for example, static random access memory (SRAM) devices or dynamic random access memory (DRAM) devices. Moreover, they can be implemented in various contexts, such as, e.g., a system-on-chip (SoC).

Referring to FIG. 1, a semiconductor memory device 10 comprises a memory cell array 110 and a selection circuit 120. Semiconductor memory device 10 can operate in a normal power mode and a low power mode. It is provided with a lower operating voltage in the low power mode than in the normal power mode. Memory cell array 110 comprises a plurality of memory cells. Selection circuit 120 assigns one data address to at least two memory cells. For example, in FIG. 1, selection circuit 120 assigns the one data address to memory cells 111 and 112.

In mobile systems, various operating characteristics may be changed according to different modes in order to preserve power such as the limited power stored in a battery. For example, in some operating modes, the power to some of elements may be cut off to reduce power consumption. In some operating modes, a frequency of a clock signal may be lowered to reduce power consumption. In some operating modes, a level of a driving voltage provided to elements in the systems may be lowered to reduce power consumption.

The level of a system operating voltage may be lowered in a low power mode, or in a stand-by mode, for example. In other words, in the low power mode, a lower operating voltage may be used to drive the system compared with a normal power mode.

Where a lower level of driving voltage is used in a semiconductor memory device, power consumption may be reduced in read and write operations. However, where the lower level of driving voltage is used, a read margin may be also reduced in the read operation due to the lower level of driving voltage. Accordingly, a sensed voltage representing data stored in a memory cell may be inaccurate due to the reduced read margin. As a result, operational stability of a memory block including the memory cells may be degraded.

Selection circuit 120 of semiconductor memory device 10 assigns one data address to at least two memory cells 111 and 112 in the low power mode, and uses the data address to read one unit of data from the at least two memory cells 111 and 112. Because one unit of data is read from the at least two memory cells 111 and 112 in a read operation, the read margin is increased. As a result, operational stability of semiconductor memory device 10 may be improved in the low power mode.

In a write operation of semiconductor memory device 10, one unit of data is concurrently written in memory cells 111 and 112. To write one unit of data in memory cells 111 and 112, selection circuit 120 concurrently enables one bit line and two wordlines in a read operation of the low power mode. Memory cells 111 and 112 are then accessed through the enabled wordlines. Because one unit of data is read from the accessed memory cells 111 and 112, the read margin may be increased in the low power mode compared with a case where data is read from only one memory cell. Therefore, operational stability of semiconductor memory device 10 may be improved in the low power mode.

In the embodiment of FIG. 1, one unit of data is written in memory cells 111 and 112 and the same data is read from memory cells 111 and 112 in the low power mode. The number of the memory cells that are written or read together is not limited to two, but may include four or eight memory cells that are concurrently enabled in a read or write operation of the low power mode.

Referring to FIG. 2, a semiconductor memory device 20 comprises a memory cell array 210 and a selection circuit 220. Selection circuit 220 assigns one data address to at least two memory cells in the low power mode, similar to selection circuit 120 of FIG. 1.

In the embodiment of FIG. 1, selection circuit 120 enables memory cells 111 and 112 by concurrently enabling one bit (or column) line and two wordlines. By contrast, selection circuit 220 of FIG. 2 enables (or accesses) two memory cells 211 and 212 by concurrently enabling one wordline and two bitlines (or column lines). Because one unit of data is read from the accessed memory cells 211 and 212, a read margin may be increased in the low power mode. Therefore, operational stability of semiconductor memory device 20 may be improved in the low power mode. In addition, semiconductor memory device 20 may operate more reliably and efficiently in the low power mode.

In the embodiment of FIG. 2, one unit of data is written in memory cells 211 and 212 and the same data is read from memory cells 211 and 212 in the low power mode. The number of memory cells that are concurrently read or written is not limited to two. For example, four or eight memory cells may be concurrently accessed by enabling four or eight bitlines in a read or write operation of the low power mode.

Figure 3:
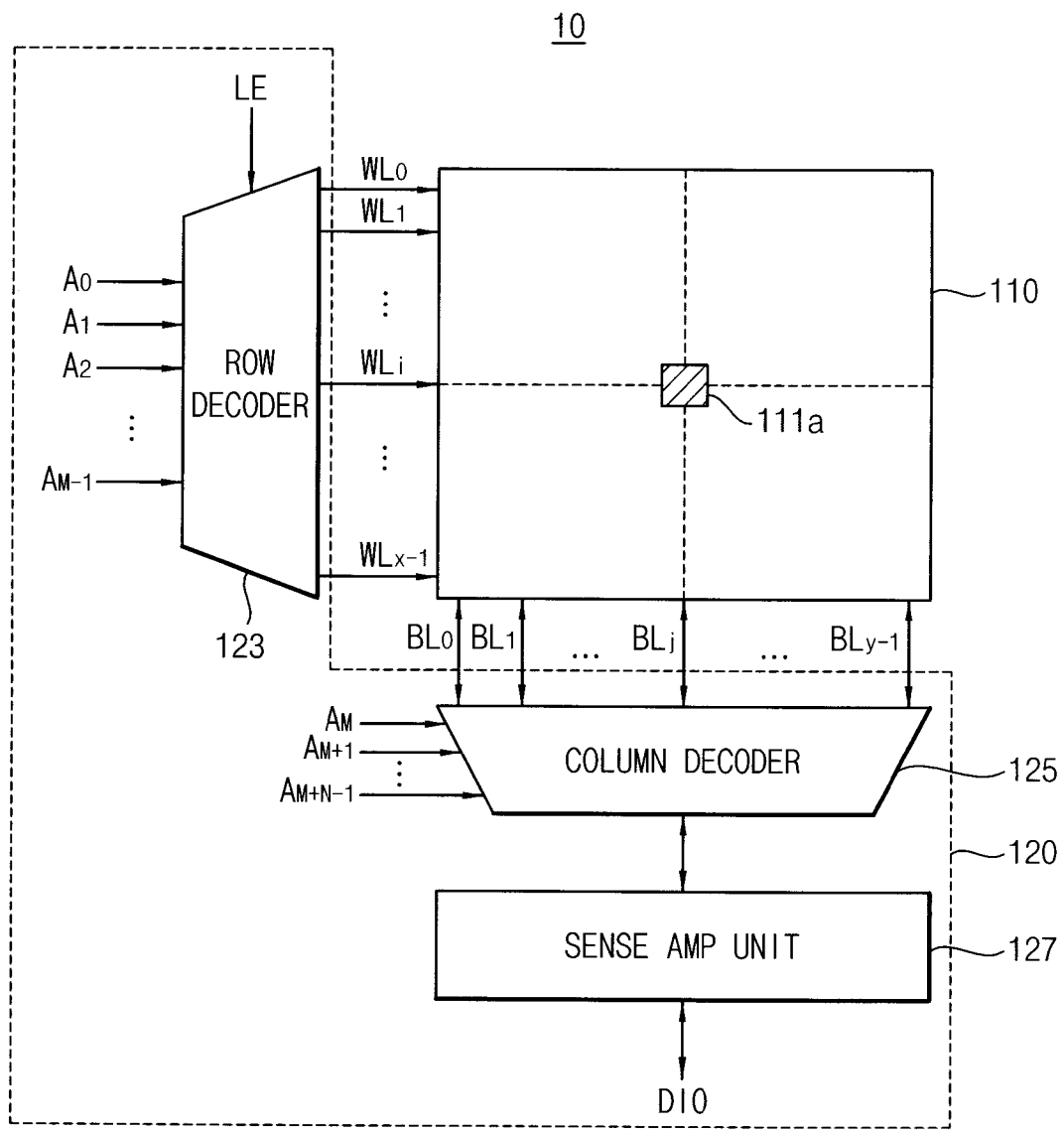
FIG. 3 is a block diagram for describing a normal power mode of the semiconductor memory device of FIG. 1 according to an embodiment of the inventive concept.

FIG. 3 is a block diagram for describing the normal power mode of semiconductor memory device 10 of FIG. 1 according to an embodiment of the inventive concept.

Referring to FIG. 3, semiconductor memory device 10 comprises memory cell array 110 and selection circuit 120. Selection circuit 120 comprises a row decoder 123, a column decoder 125 and a sense amplifier unit 127.

Memory cell array 110 comprises a plurality of memory cells. In the normal power mode, a memory cell 111a is selected by row decoder 123 and column decoder 125. In the embodiment of FIG. 3, memory addresses for accessing the memory cells in memory cell array 110 each include an M+N bit sequence such as $A_0 A_1 A_2 \ldots A_{M+N-1}$.

M bits of the M+N bit sequences represent row addresses, and N bits of the M+N bit sequences represent column addresses. That is, M bit sequences of $A_0 A_1 A_2 \ldots A_{M-1}$ represent row addresses, and N bit sequences of $A_M A_{M+1} \ldots A_{M+N-1}$ represent column addresses. Each memory cell of memory cell array 110 stores one-bit data. In the embodiment of FIG. 3, memory cell array 110 comprises $2^M$ rows and $2^N$ columns, and thus, memory cell array 110 may have storage capacity of $2^{M+N}$ bits. For example, where a memory cell array has a storage capacity of one mega-bit, memory cell array 110 may comprise 1024 rows and 1024 columns (M=N=10).

Row decoder 123 receives the M bits of row addresses $A_0$ $A_1 \ldots A_{M-1}$. In the normal power mode, row decoder 123 enables one of X wordlines $WL_0, WL_1, \ldots, WL_{X-1}$ based on the M bits of row addresses $A_0 A_1 \ldots A_{M-1}$. For example, row decoder 123 may enable wordline $WL_i$ corresponding to memory cell 111a. In an example embodiment, the values of M and X are related by the following Equation (1).

$$X=2^M \qquad (1)$$

Semiconductor memory device 10 assigns one data address to memory cell 111a by enabling one wordline in an operation of the normal power mode. In the normal power mode, a low power mode enable signal LE which is deactivated is applied to row decoder 123. Row decoder 123 enables one wordline in a read operation or a write operation when low power mode enable signal LE is deactivated. Therefore, semiconductor memory device 10 assigns one data address to one memory cell 111a in the normal power mode.

Column decoder 125 receives the N bits of column addresses $A_M, A_{M+1}, \ldots, A_{M+N-1}$. In the normal power mode, column decoder 125 selects one of Y bitlines $BL_0, BL_1, \ldots, BL_{y-1}$ based on the N bits of column addresses $A_M, A_{M+1}, \ldots, A_{M+N-1}$. For example, column decoder 125 may enable wordline $BL_j$ corresponding to memory cell 111a. In an example embodiment, the values of N and Y are related to Y by the following Equation (2).

$$Y=2^N \qquad (2)$$

Column decoder 125 selects data of one memory cell 111a of Y memory cell data designated by the row address. As a result, column decoder 125 outputs the data of memory cell 111a corresponding to enabled wordline $WL_i$ and selected bitline $BL_j$. Column decoder 125 provides the data to sense amplifier unit 127.

Sense amplifier unit 127 comprises at least one sense amplifier (not illustrated). The sense amplifier outputs a digital signal in full-swing range such as from 0 to $V_{DD}$. In a read operation, sense amplifier unit 127 amplifies the data provided from column decoder 125 to provide output data DIO.

In a write operation of semiconductor memory device 10, data to be stored in memory cell 111a is input through sense amplifier unit 127. Memory cell 111a in which data DOI is to be stored may be selected by a row address and a column address. In a write operation, sense amplifier unit 127 operates as a driver for transferring the data to memory cell 111a. Row decoder 123 enables wordline $WL_i$ based on row addresses $A_0 A_1 \ldots A_{M-1}$, and column decoder 125 selects bitline $BL_j$ based on column addresses $A_M, A_{M+1}, \ldots, A_{M+N-1}$. Data DOI input to sense amplifier unit 127 is stored in memory cell 111a specified by wordline $WL_i$ and bitline $BL_j$.

In the normal power mode of semiconductor memory device 10, a read margin may be improved because the driving voltage is generated with a sufficient level. However, in the low power mode of the semiconductor memory device, the read margin may be inadequate because the driving voltage with a lower level is provided. Therefore, operational stability of semiconductor memory device 10 may be degraded in the low power mode.

Figure 4:
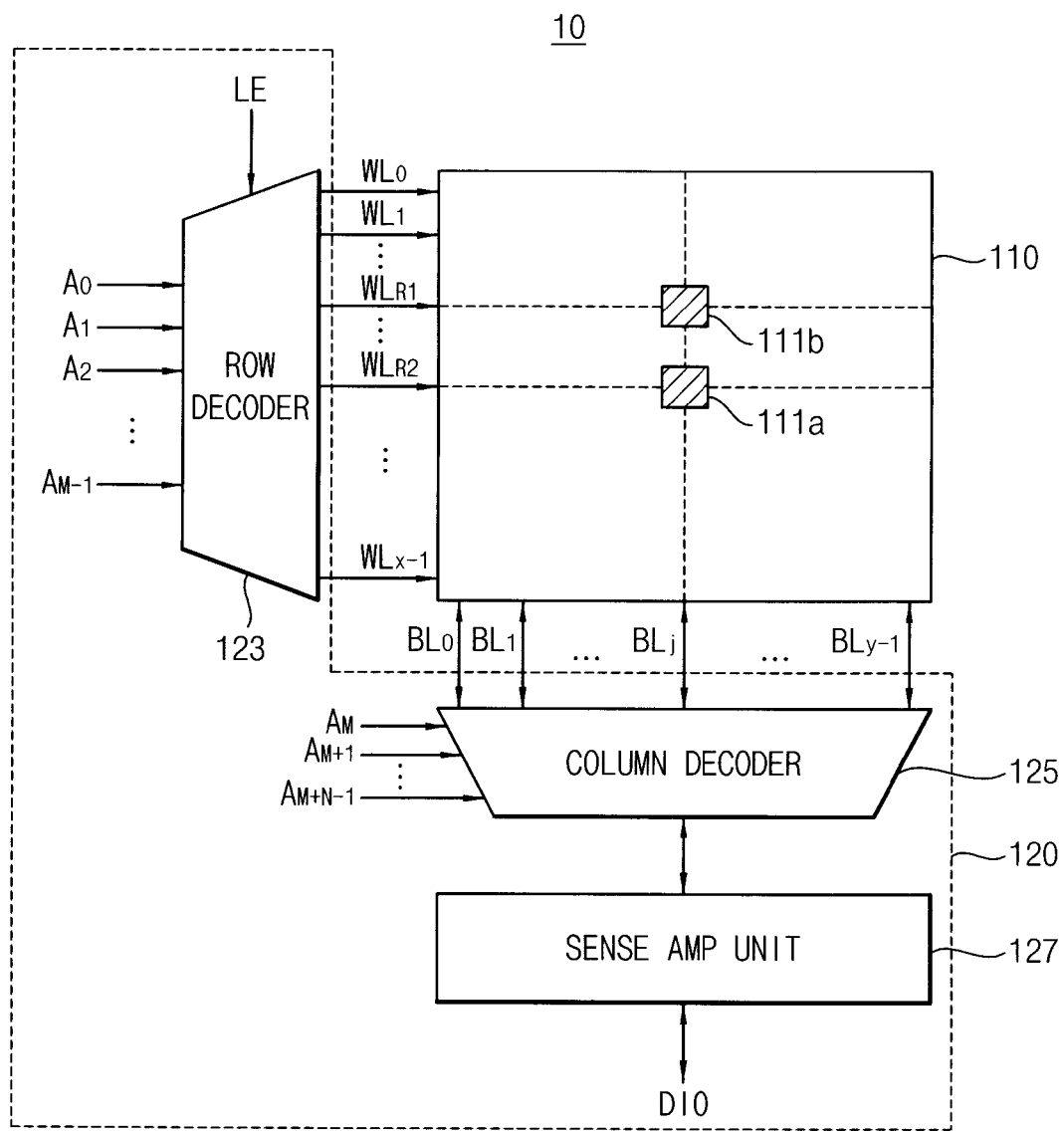
FIG. 4 is a block diagram for describing a low power mode of the semiconductor memory device of FIG. 1 according to an embodiment of the inventive concept.

FIG. 4 is a block diagram for describing the low power mode of semiconductor memory device 10 of FIG. 1 according to an embodiment of the inventive concept.

Referring to FIG. 4, in the low power mode, row decoder 123 assigns one data address to memory cells 111a and 111b by concurrently enabling wordlines $WL_{R1}$ and $WL_{R2}$. Selection circuit 120 assigns one data address to memory cells 111a and 111b corresponding to wordlines $WL_{R1}$ and $WL_{R2}$ and bitline $BL_j$. Where low power mode enable signal LE is activated, row decoder 123 concurrently enables wordlines $WL_{R1}$ and $WL_{R2}$ among wordlines $WL_0, WL_1, \ldots, WL_{X-1}$. To concurrently enable wordlines $WL_{R1}$ and $WL_{R2}$, row decoder 123 receives a second row address (or, low power row address) which is used in the low power mode and comprises fewer bits than a first row address (normal row address) comprising M bits, used in the normal power mode by one bit. Row decoder 123 concurrently enables wordlines $WL_{R1}$ and $WL_{R2}$ based on the second row address.

In a read operation of the low power mode, row decoder 123 enables wordlines $WL_{R1}$ and $WL_{R2}$. Bitlines $BL_0$, $BL_1, \ldots, BL_{y-1}$ transfer data from memory cells corresponding to wordlines $WL_{R1}$ and $WL_{R2}$ to column decoder 125. Column decoder 125 provides sense amplifier unit 127 with the data of memory cells 111a and 111b connected to bitline $BL_j$ selected based on column addresses $A_M, A_{M+1}, \ldots, A_{M+N-1}$. Sense amplifier unit 127 amplifies the data from column decoder 125 to generate output data DOI.

In a write operation of the low power mode, data DOI to be stored in memory cells 111a and 111b is input through sense amplifier unit 127. Memory cells 111a and 111b in which one unit of data DOI is to be stored may be selected by a row address and a column address. In the write operation, sense amplifier unit 127 operates as a driver for transferring the data to memory cell 111a.

As described with reference to FIGS. 3 and 4, semiconductor memory device 10 assigns one data address to one memory cell in the normal power mode, and it assigns one data address to at least two memory cells (or two or more memory cells) in the low power mode. In a write operation of the low power mode, semiconductor memory device 10 writes the same data in at least two memory cells to which one data address is assigned. In addition, in a read operation of the low power mode, semiconductor memory device 10 reads data from at least two memory cells to which one data address is assigned. Because the data is read from at least two memory cells, a read margin of the sense amplifier in a read operation may be improved. Therefore, operational stability of the semiconductor memory device may be enhanced in the low power mode using the lower driving voltage than the normal power mode.

Figure 5:
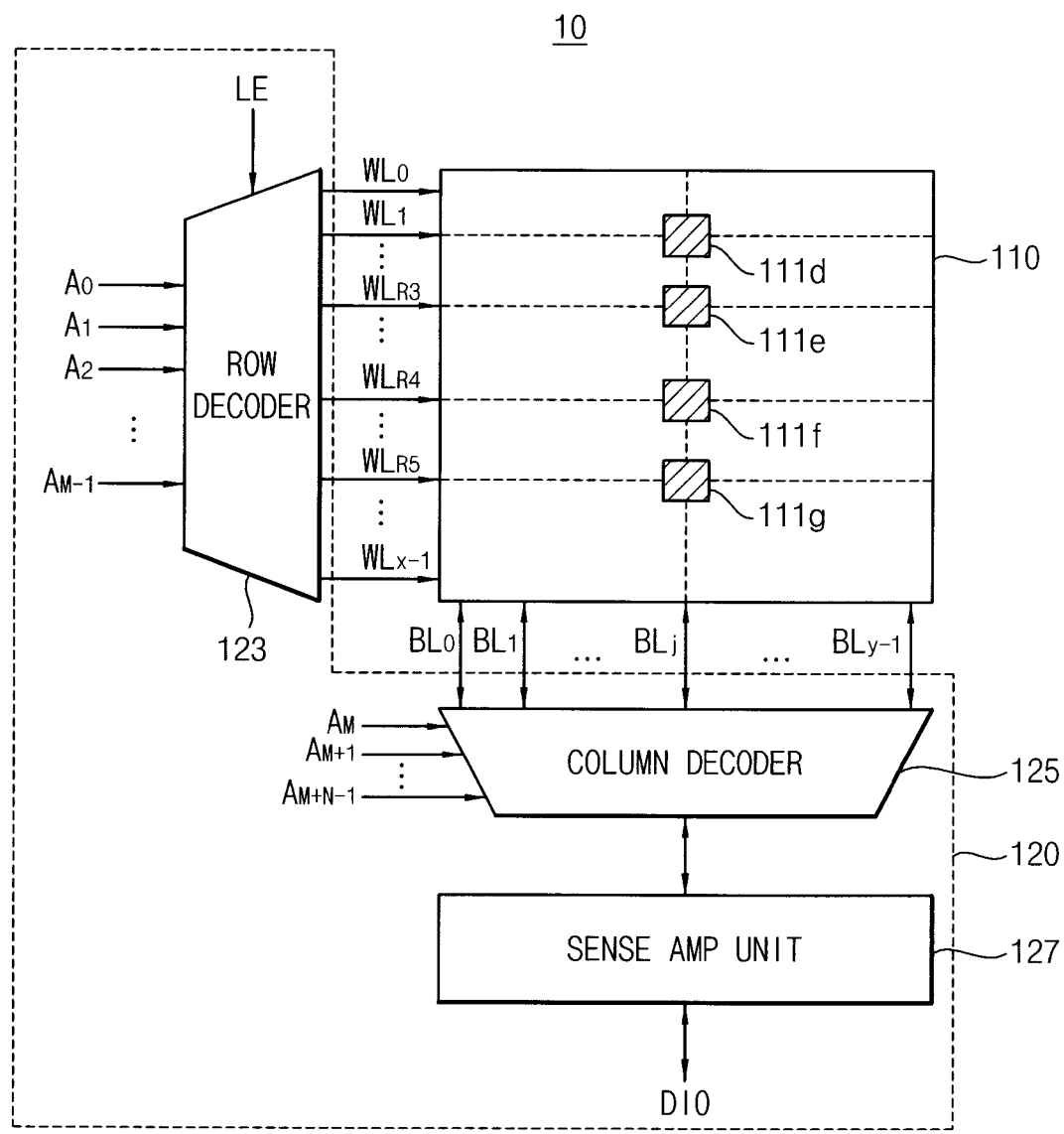
FIG. 5 is a block diagram for describing a low power mode of the semiconductor memory device of FIG. 1 according to an embodiment of the inventive concept.

FIG. 5 is a block diagram for describing the low power mode of semiconductor memory device 10 of FIG. 1 according to an embodiment of the inventive concept. In the embodiment of FIG. 5, semiconductor memory device 10 assigns one data address to four memory cells 111d, 111e, 111f and 111g by concurrently enabling four wordlines.

Referring to FIG. 5, in the low power mode, row decoder 123 assigns one data address to four memory cells 111d, 111e, 111f and 111g by concurrently enabling four wordlines $WL_{R1}$, $WL_{R2}$, $WL_{R3}$ and $WL_{R4}$. Where low power mode enable signal LE is activated, row decoder 123 concurrently enables wordlines $WL_{R1}$, $WL_{R2}$, $WL_{R3}$ and $WL_{R4}$ of wordlines $WL_0, WL_1, \ldots, WL_{X-1}$. To concurrently enable wordlines $WL_{R1}$ and $WL_{R2}$, row decoder 123 receives a second row address (or, low power row address) which is used in the low power mode and comprises fewer bits than a first row address (normal row address) used in the normal power mode by two bits. Row decoder 123 concurrently enables wordlines $WL_{R1}$, $WL_{R2}$, $WL_{R3}$ and $WL_{R4}$ based on the second row address.

Like the example of FIG. 4, the example of FIG. 5 can also improve operational stability of semiconductor memory device 10 in the low power mode by increasing a read margin.

Figure 6:
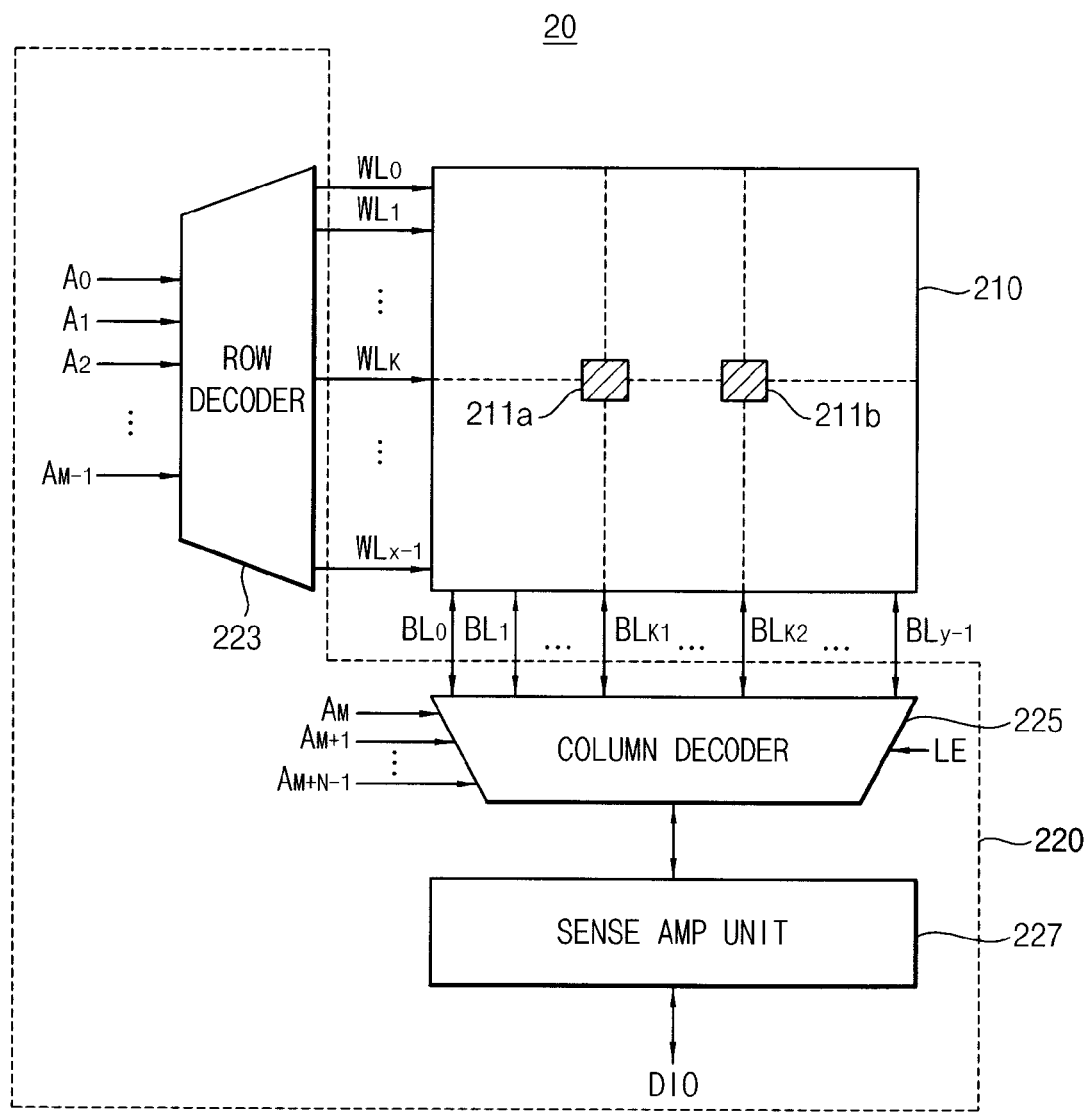
FIG. 6 is a block diagram for describing a low power mode of the semiconductor memory device of FIG. 2 according to an embodiment of the inventive concept.

FIG. 6 is a block diagram for describing the low power mode of semiconductor memory device 20 of FIG. 2 according to an embodiment of the inventive concept.

Referring to FIG. 6, semiconductor memory device 20 comprises memory cell array 210 and selection circuit 220. Selection circuit 220 comprises a row decoder 223, a column decoder 225, and a sense amplifier unit 227.

Unlike the embodiments of FIGS. 4 and 5, semiconductor memory device 20 assigns one data address to at least two memory cells by concurrently enabling at least two bitlines. In the low power mode, column decoder 225 in semiconductor memory device 20 assigns one data address to memory cells 211a and 211b by concurrently enabling bitlines $BL_{K1}$ and $BL_{K2}$ among bitlines $BL_0, \ldots, BL_{y-1}$.

In a read operation of the low power mode, row decoder 223 enables one wordline $WL_K$ based on row addresses $A_0, \ldots, A_{M-1}$. Data of the memory cells connected to the enabled wordline $WL_K$ is transferred to column decoder 225 through each of bitlines $BL_0, \ldots, BL_{y-1}$. In the low power mode, low power mode enable signal LE is activated. Where low power mode enable signal LE is activated, column decoder 225 receives a second column address (or, low power column address) which is used in the low power mode and comprises fewer bits than a first column address (normal column address) used in the normal power mode by one bit. Column decoder 225 concurrently selects bitlines $BL_{K1}$ and $BL_{K2}$ based on the second column address, and it provides sense amplifier unit 227 with the data from memory cells 211a and 211b. Sense amplifier unit 227 amplifies the data from column decoder 225 to generate output data DOI.

Semiconductor memory device 20 enables bitlines $BL_{K1}$ and $BL_{K2}$ to assign one data address to memory cells 211a and 211b. To enhance the read margin of the read operation, data from bitlines $BL_{K1}$ and $BL_{K2}$ is provided to one sense amplifier. The data from memory cells 211a and 211b is concurrently input to the one sense amplifier. Therefore, at least two bitlines are connected to one sense amplifier in the low power mode. Sense amplifier unit 227 comprises a plurality of sense amplifiers.

Figure 7:
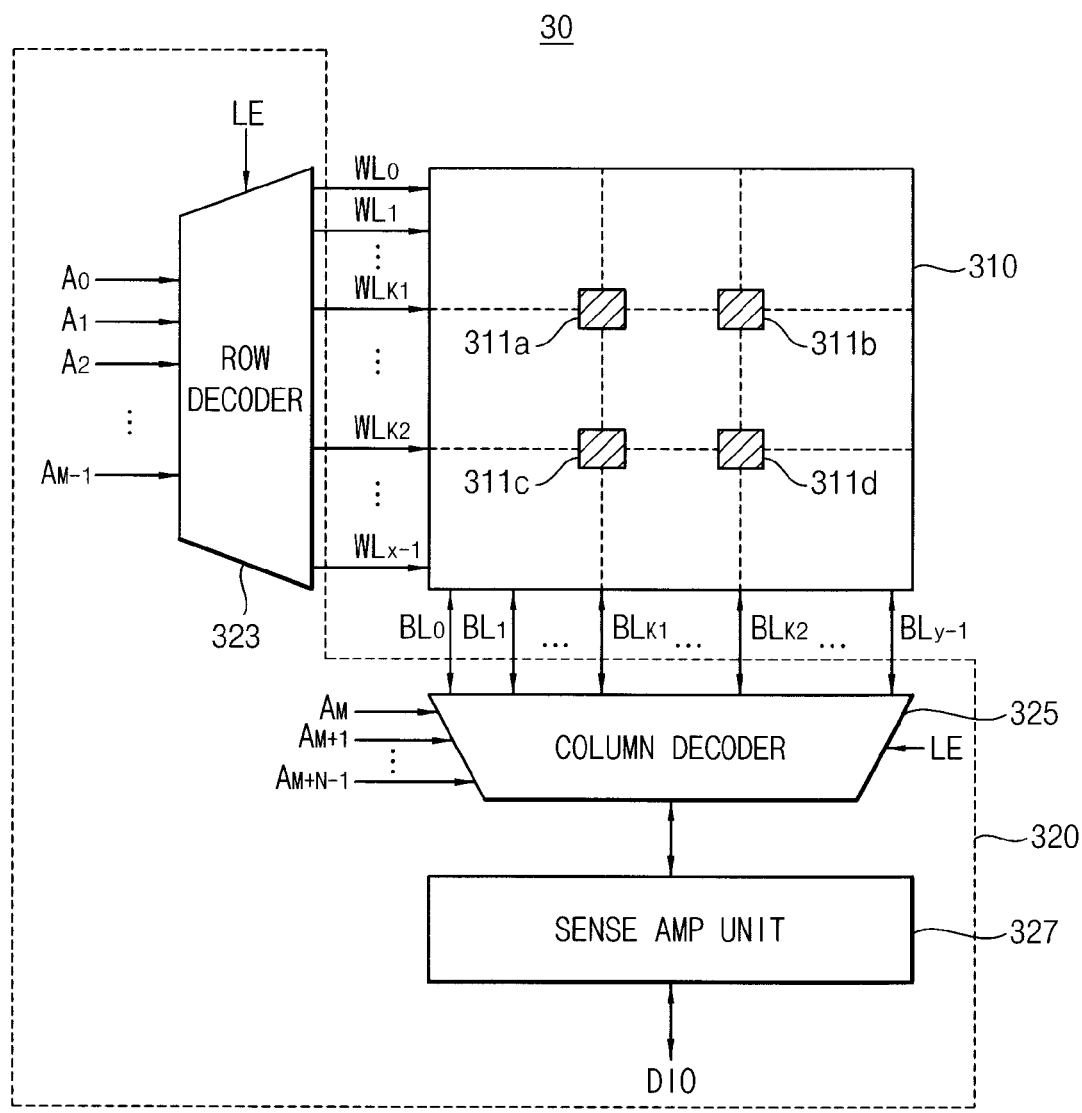
FIG. 7 is a block diagram for describing a low power mode of a semiconductor memory device according to an embodiment of the inventive concept.

FIG. 7 is a block diagram for describing a low power mode of a semiconductor memory device 30 according to an embodiment of the inventive concept. In the embodiment of FIG. 7, semiconductor memory device 30 assigns one data address to four memory cells by concurrently enabling two wordlines and two bitlines in the low power mode.

Referring to FIG. 7, semiconductor memory device 30 comprises memory cell array 310 and selection circuit 320. Selection circuit 320 comprises a row decoder 323, a column decoder 325 and a sense amplifier unit 327.

Low power mode enable signal LE is activated in the low power mode, and it is applied to row decoder 323 and column decoder 325. In the low power mode, row decoder 323 concurrently enables wordlines $WL_{K1}$ and $WL_{K2}$ and column decoder 325 concurrently enables bitlines $BL_{K1}$ and $BL_{K2}$ in the low power mode. Therefore, one data address is assigned to four memory cells 311a, 311b, 311c and 311d.

In a read operation of the low power mode, row decoder 323 receives the second row address in response to low power mode enable signal LE. As described with reference to FIG. 4, the second low row address comprises fewer bits than the first row address by one bit. Row decoder 323 enables wordlines $WL_{K1}$ and $WL_{K2}$ based on the second row address.

The memory cells connected to the enabled wordlines $WL_{K1}$ and $WL_{K2}$ output data through bitlines $BL_0, BL_1, \ldots, BL_{y-1}$. Because enabled wordlines $WL_{K1}$ and $WL_{K2}$ are connected to each of bitlines $BL_0, BL_1, \ldots, BL_{y-1}$, each of bitlines $BL_0, BL_1, \ldots, BL_{y-1}$ outputs data from multiple memory cells to column decoder 325. Column decoder 325 selects bitlines $BL_{K1}$ and $BL_{K2}$ based on the second column address. Column decoder 325 provides sense amplifier unit 327 with the data from selected bitlines $BL_{K1}$ and $BL_{K2}$. Sense amplifier unit 327 amplifies the data from column decoder 325 to generate output data DOI. Output data DOI is data stored in four memory cells 311a, 311b, 311c and 311d connected to wordlines $WL_{K1}$ and $WL_{K2}$ and bitlines $BL_{K1}$ and $BL_{K2}$.

In a write operation of the low power mode, data DOI to be stored in memory cells 311a, 311b, 311c and 311d is input through sense amplifier unit 327. Row decoder 323 enables wordlines $WL_{K1}$ and $WL_{K2}$ based on low power mode enable signal LE, which is activated. Column decoder 325 selects bitlines $BL_{K1}$ and $BL_{K2}$ based on the activated low power mode enable signal LE. Therefore, one unit of data DOI input through sense amplifier unit 327 is stored in four memory cells 311a, 311b, 311c and 311d.

FIG. 8 is a table for explaining a first row address used when semiconductor memory device 10 operates in the normal power mode.

In the embodiment of FIG. 8, a first row address comprising three bits is illustrated. In this case, eight row addresses may be represented based on combination of the three bits. Eight row addresses correspond to eight wordlines $WL_0, \ldots, WL_7$. For example, where row address $A_0 A_1 A_2$ is '110', wordline $WL_6$ is enabled. Only one wordline is enabled in response to any row address $A_0 A_1 A_2$. Therefore, one data address is assigned to one memory cell.

FIG. 9 is a table for explaining a second row address used when semiconductor memory device 10 operates in the low power mode.

Similar to FIG. 8, the second row address comprising three bits is illustrated. The second row address differs from the first row address in that first bit $A_0$ is a "don't care" bit. Semiconductor memory device 10 assigns first bit $A_0$ of the second row address as the "don't care" bit for concurrently enabling two wordlines in the low power mode.

Where first bit $A_0$ of the second row address is assigned as the "don't care" bit in the low power mode, the data address may be determined by remaining bits $A_1$ and $A_2$ of the second row address. First bit $A_0$ of the second row address, which is assigned as the "don't care" bit, may not influence the row decoder to enable which wordline. For example, in the normal power mode, eight wordlines may be discriminated with respect to one another by eight row addresses which are generated based on combination of three bits of the row address as described with reference to FIG. 8. However, in the low power mode, eight wordlines may be discriminated by a two-bit row address. Therefore, one row address may be assigned to two wordlines.

For example, in the normal power mode, where each bit of row address $A_0 A_1$ and $A_2$ is '010', wordline $WL_2$ may be enabled. When each bit of row address $A_0 A_1$ and $A_2$ is '110', wordline $WL_6$ may be enabled. On the other hand, where first bit $A_0$ of the row address is converted to the "don't care" bit, the second row address comprises two bits. Where each bit of the second row address $A_1$ and $A_2$ is '10', wordlines $WL_2$ and $WL_6$ may be concurrently enabled.

The row decoder in semiconductor memory device 10 concurrently enables at least two wordlines by converting at least one bit of the first row address to the "don't care" bit in the low power mode.

In other embodiments, the row decoder of semiconductor memory device 10 may convert two or more bits of the first row address to the "don't care" bit in the low power mode. For example, where the row decoder converts two bits of the first row address to the "don't care" bit in the low power mode, four wordlines may be concurrently enabled as illustrated in FIG. 5. In still other example embodiments, the column decoder of semiconductor memory device 20 may concurrently enable at least two wordlines by converting at least one bit of the first column address to the "don't care" bit in the low power mode as illustrated in FIG. 6.

Figure 10:
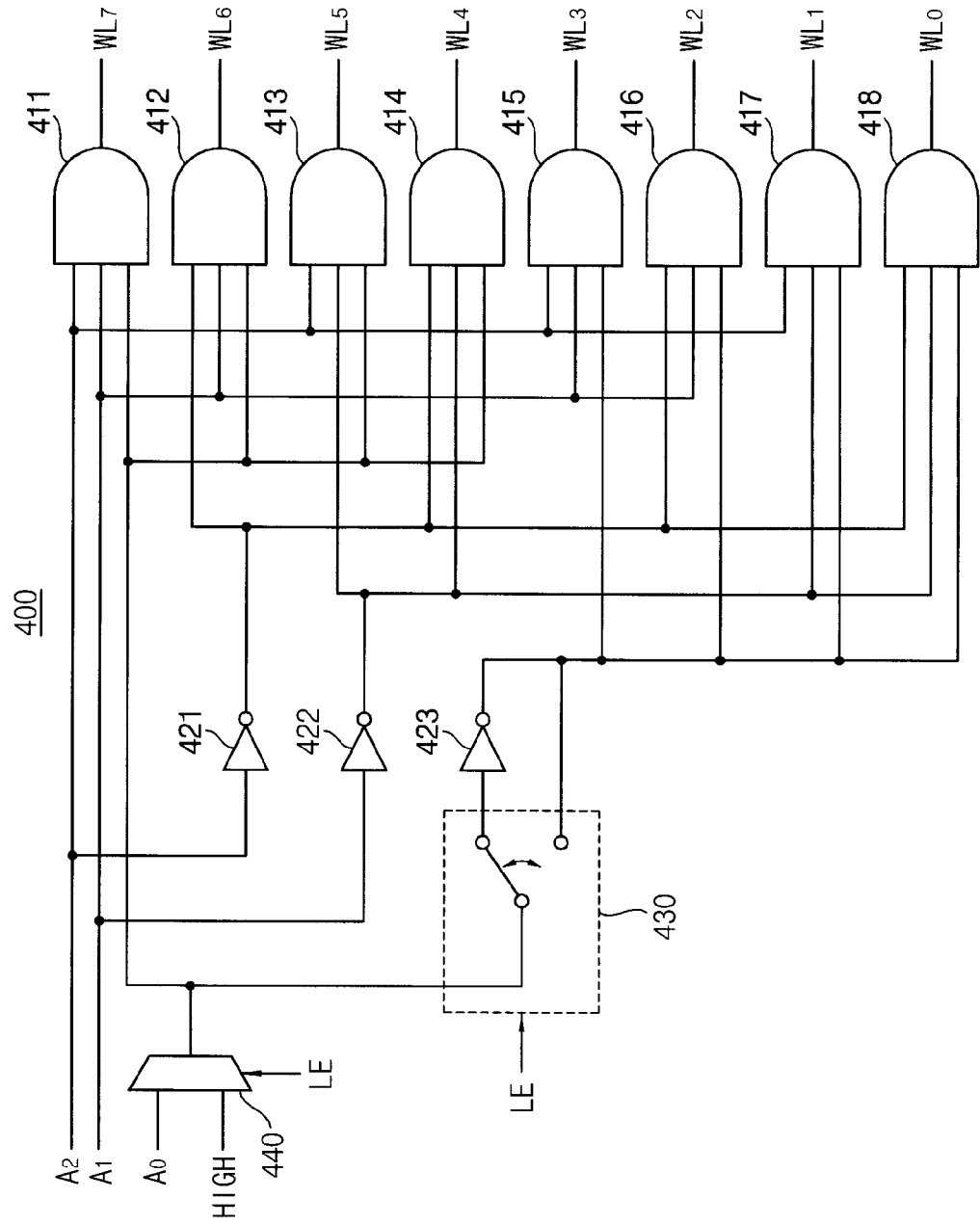
FIG. 10 is a circuit diagram illustrating an example of a row decoder in a semiconductor memory device according to an embodiment of the inventive concept.

FIG. 10 is a circuit diagram illustrating an example of a row decoder 400 in a semiconductor memory device according to an embodiment of the inventive concept. Row decoder 400 can be used, for instance, in semiconductor memory device 10, 20, or 30 of FIGS. 1-7.

Referring to FIG. 10, a row decoder 400 comprises a plurality of AND gates 411~418, a plurality of inverters 421, 422 and 423, a switching unit 430 and an address conversion unit 440. Each of AND gates 411~418 is connected to one of wordlines $WL_7$, $WL_6$, ..., $WL_0$. Address conversion unit 440 converts the first row address used in the normal power mode to the second row address used in the low power mode in response to low power mode enable signal LE. Address conversion unit 440 selects one of address bit $A_0$ and logic high level HIGH in response to low power mode enable signal LE. Switching unit 430 switches a decoding path corresponding to address bit $A_0$ in response to low power mode enable signal LE. Row decoder 400 can have different decoding paths based on switching states of switching unit 430. In addition, switching unit 400 may switch at least two wordlines to at least two memory cells in response to low power mode enable signal LE.

Where low power mode enable signal LE is deactivated in the normal power mode, address conversion unit 440 selects address bit $A_0$, which may have logic value of '0' or '1'. In addition, switching unit 430 switches the decoding path connected to address bit $A_0$ such that the decoding path connected to address bit $A_0$ comprises inverter 423. An example of a path for selecting one wordline of wordlines $WL_0$, $WL_1$, ..., $WL_7$ by decoding the first row address in the normal power mode is described below with reference to FIG. 11.

Where low power mode enable signal LE is activated in the low power mode, address conversion unit 440 selects a signal HIGH with a logic high level. Therefore, address conversion unit 440 outputs the logic high level. In addition, switching unit 430 switches the decoding path connected to address conversion unit 440 such that the decoding path connected to address conversion unit 440 does not include inverter 423. An example of a path for selecting two wordlines of wordlines $WL_0$, $WL_1$, ..., $WL_7$ by decoding the second row address in the low power mode is described below with reference to FIG. 12.

Figure 11:
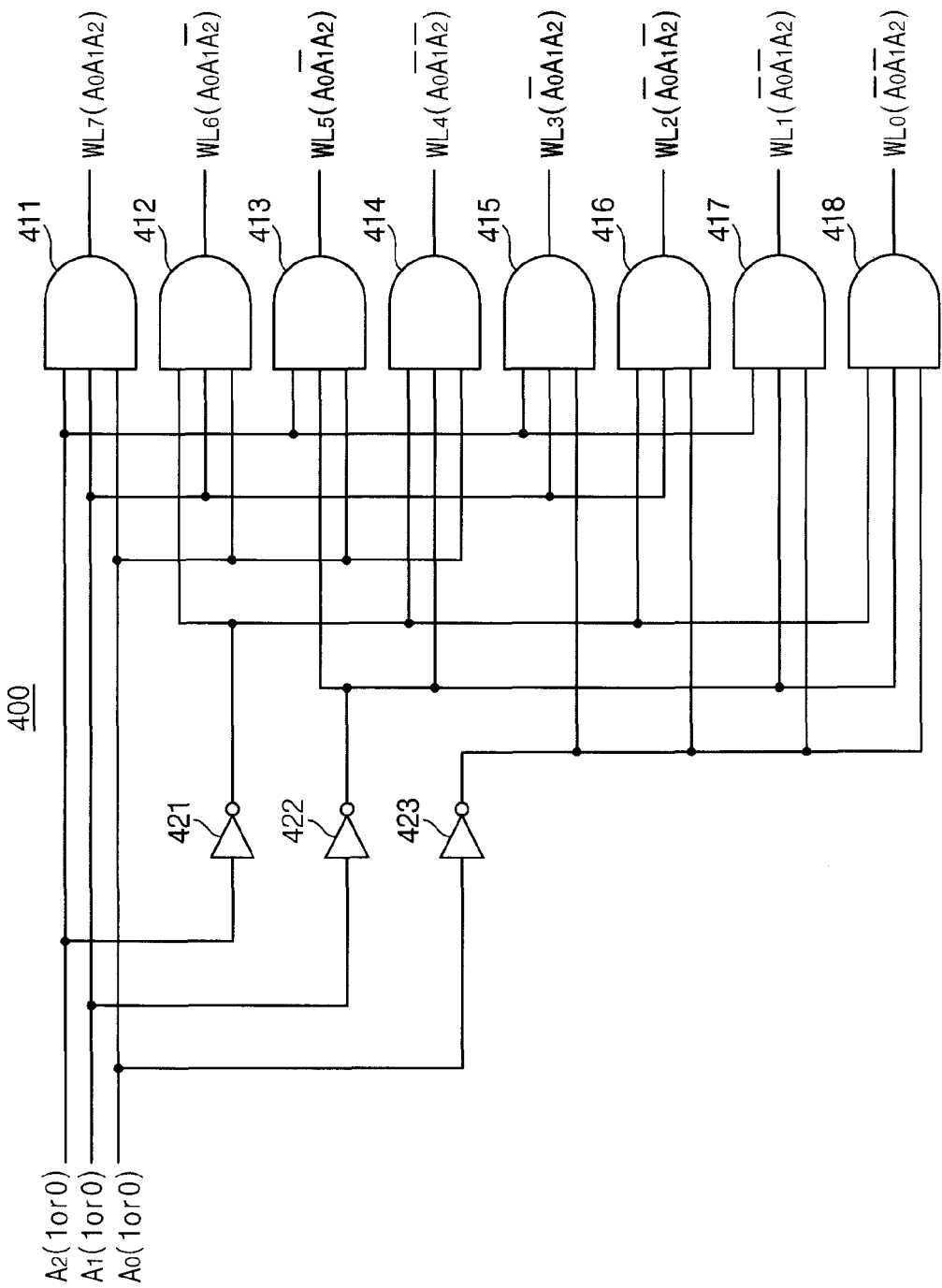
FIG. 11 is circuit diagram illustrating decoding paths of the row decoder of FIG. 10 in a normal power mode.

FIG. 11 is circuit diagram illustrating decoding paths of row decoder 400 of FIG. 10 in the normal power mode. In the embodiment of FIG. 11, switching unit 430 and address conversion unit 440 are omitted for convenience of explanation. Low power mode enable signal LE is deactivated in the normal power mode.

Referring to FIGS. 10 and 11, where low power mode enable signal LE is deactivated, address conversion unit 440 selects address bit $A_0$ of address bit $A_0$, and switching unit 430 switches address conversion unit 440 to inverter 423. In this case, row decoder 400 operates as a demultiplexer.

One of wordlines $WL_7$, $WL_6$, ..., $WL_0$, which are connected to AND gates 411~418, is enabled based on row address bits $A_0$, $A_1$ and $A_2$. FIG. 11 shows each Boolean combination corresponding to wordlines $WL_7$, $WL_6$, ..., $WL_0$. For example, where the row address bits $A_0$, $A_1$ and $A_2$ are '011', wordline $WL_3$ is enabled. Where the semiconductor memory device operates in the normal power mode, row decoder 400 operates as a general row decoder. That is, row decoder 400 enables one of wordlines $WL_7$, $WL_6$, ..., $WL_0$ by decoding the first row address bits $A_0$, $A_1$ and $A_2$.

Figure 12:
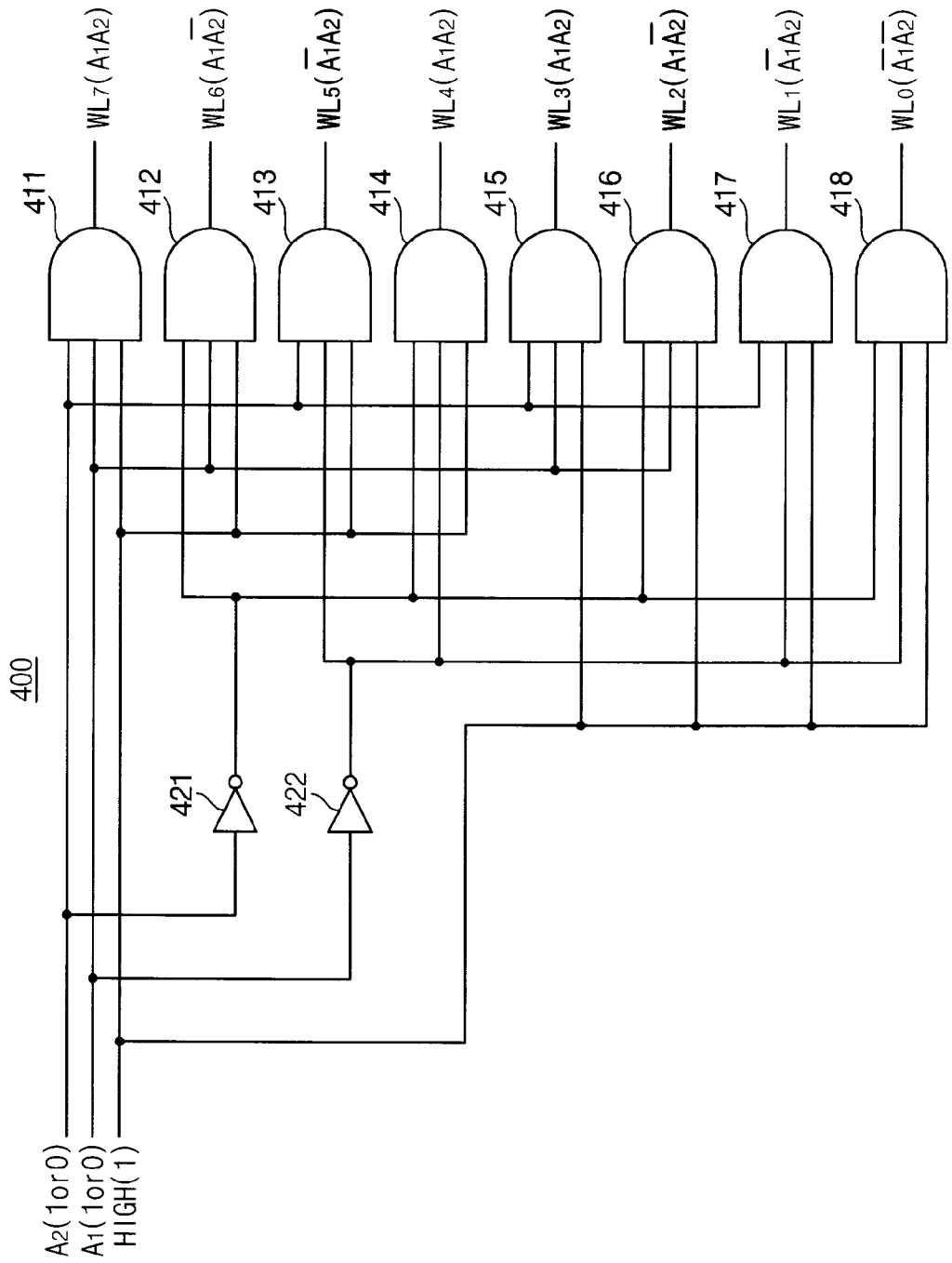
FIG. 12 is circuit diagram for illustrating decoding paths of the row decoder of FIG. 10 in a low power mode.

FIG. 12 is circuit diagram for illustrating decoding paths of row decoder 400 of FIG. 10 in the low power mode. In the embodiment of FIG. 12, switching unit 430 and address conversion unit 440 are omitted for convenience of explanation. Low power mode enable signal LE is activated in the low power mode.

Referring to FIGS. 10 and 12, where low power mode enable signal LE is activated, address conversion unit 440 selects the signal HIGH. Where low power mode enable signal LE is activated, switching unit 430 switches address conversion unit 440 to a decoding path that does not include inverter 423.

Row decoder 400 in the semiconductor memory device receives the second row address (or low power row address), which includes fewer bits than the first row address by one bit in the low power mode. More particularly, row decoder 400 may receive the second row address which comprises two bits $A_1$ and $A_2$ because address conversion unit 440 selects the signal HIGH instead of row address bit $A_0$. Outputs of AND gates 411~414 and 415~418 corresponds to the same Boolean equations. Therefore, a pair of wordlines of the $WL_7$, $WL_6$, ..., $WL_0$ is concurrently enabled based on combination of row address bits $A_1$ and $A_2$. For example, where second row address bits $A_1$ and $A_2$ are '11', wordlines $WL_3$ and $WL_7$ corresponding to a same Boolean expression are concurrently enabled. Because row address bit $A_0$ is not selected in address conversion unit 440 in the low power mode, row address bit $A_0$ does not influence enabling of wordlines of the $WL_7$, $WL_6$, ..., $WL_0$. Therefore, row decoder 12 concurrently enables two wordlines based on the second lower address which comprises fewer bits than the first row address by one bit.

In other embodiments, address conversion unit 440 converts two bits to the "don't care" bits, and row decoder 400 concurrently selects four wordlines as illustrated in FIG. 5. In still other embodiments, the semiconductor memory device concurrently enables two or more bitlines. In this case, the column decoder may receive the second column address having fewer bits than the first column address used in the normal power mode by one bit. The column decoder then concurrently selects (or enables) two bitlines in response to the second column address.

Figure 13:
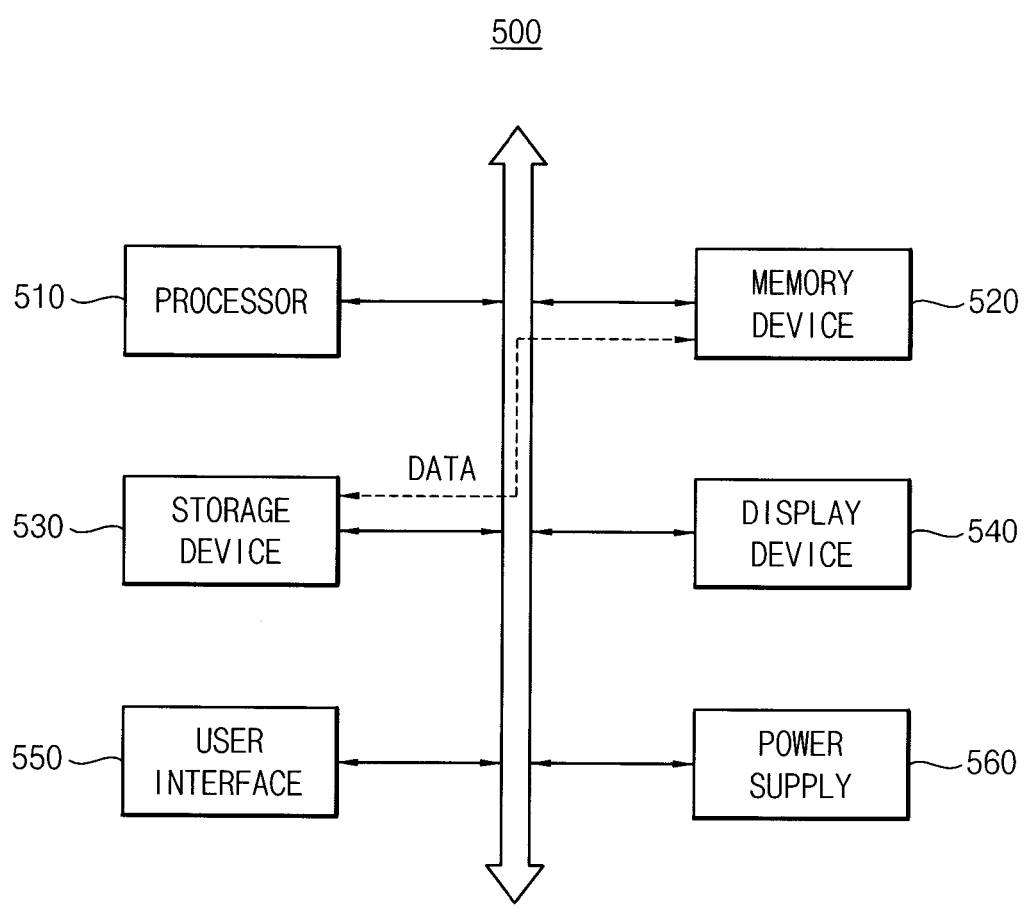
FIG. 13 is a block diagram illustrating a system comprising a semiconductor memory device according to an embodiment of the inventive concept.

FIG. 13 is a block diagram illustrating a system 500 comprising a semiconductor memory device according to some exemplary embodiments.

Referring to FIG. 13, system 500 comprises a processor 510, a semiconductor memory device 520, a storage device 530, a display device 540, a user interface 550 and a power supply 560. System 500 can be, for example, a mobile phone, a smart phone, a personal digital assistant (PDA), a laptop computer, a portable multimedia player (PMP), a digital camera, a music player, a portable game console, or a navigation system. Although not illustrated in FIG. 13, system 500 can further comprise a plurality of ports for communicating with a video card, a sound card, a memory card, a universal serial bus (USB) device, or various other types of electric devices. System 500 may further comprise other components such as a baseband chipset, an application chipset, or an image sensor, for example.

Processor 510 performs various computing functions and may comprise, for example, a microprocessor or a CPU.

Processor 510 can be connected to memory device 520, storage device 530, and display device 540 via a bus such as an address bus, a control bus, or a data bus. Processor 510 can also be connected to an extended bus such as a peripheral component interconnection (PCI) bus.

Storage device 520 can comprise, for example, a solid state drive device, a hard disk drive device, a CD-ROM device. User interface 550 can comprise one of various technologies for interconnecting a user and system 500, such as a key pad, a touch screen, or a speaker. Power supply 560 provides a power for operations of electronic system 500. In some embodiments, system 500 further comprises a camera image processor (CIS).

Semiconductor memory device 520 may be operated as follows. Semiconductor memory device 520 can assign one data address to at least two memory cells and read data from the at least two memory cells in a low power mode, as described above in relation to various embodiments of the inventive concept. In addition, semiconductor memory device 520 can assign one data address to one memory cell and read data from one memory cell in a normal power mode. Therefore, operational stability of semiconductor memory device 520 may be improved in the low power mode due to an increased read margin.

Semiconductor memory device 520 may reconfigure or initialize the data stored in memory cells of a memory cell array when the operating mode of semiconductor memory device 520 transitions from the normal power mode to the low power mode to account for potential address mismatches.

In some embodiments, semiconductor memory device 520 backs up data DATA stored in the memory cell array to external storage device 530 before reconfiguring or initializing the memory cells. For example, in FIG. 13, a back-up path is represented as a dotted arrow. In other words, semiconductor memory device 520 may provide data DATA stored in the memory cell array to external storage device 530 before initializing the memory cells. Storage device 530 can then temporarily store data DATA provided from semiconductor memory device 520.

After data DATA is stored in storage device 530, semiconductor memory device 520 initializes the memory cells in the memory cell array. After initializing the memory cells, semiconductor memory device 520 transitions from the low power mode to the normal power mode, and semiconductor memory device 520 may store data DATA stored in storage device 530 in the memory cell array. That is, semiconductor memory device 520 backs up data DATA stored in the memory cell array before initializing the memory cells, and writes the backed-up data DATA in the memory cell array after initializing the memory cells. Consequently, semiconductor memory device 520 coherently uses the data stored in the memory cell array without regard to change of power mode.

The described embodiments can be applied in numerous and diverse contexts, such as desktop computers, server computers, workstations, notebook computers, tablet computers, mobile phones, personal digital assistants, portable multimedia players, digital cameras, and portable game consoles, to name but a few.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor memory device having a normal power mode and a low power mode, wherein the semiconductor memory device is provided with a lower level of operating voltage in the low power mode than in the normal power mode, the semiconductor memory device comprising:
a memory cell array comprising a plurality of memory cells; and
a selection circuit configured to assign one data address to at least two memory cells, and further configured to read one unit of data from the at least two memory cells in the low power mode,
wherein a same data is written in the at least two memory cells to which the one data address is assigned in a write operation of the low power mode.

2. The semiconductor memory device of claim 1, wherein the memory cell array is a static random access memory (SRAM) cell array.

3. The semiconductor memory device of claim 1, wherein the selection circuit comprises a row decoder and a column decoder, and the row decoder concurrently enables at least two wordlines and assigns the one data address to the at least two memory cells in the low power mode.

4. The semiconductor memory device of claim 1, wherein one sense amplifier in the selection circuit senses and reads data written in the at least two memory cells to which the one data address is assigned in a read operation of the low power mode.

5. The semiconductor memory device of claim 3, wherein the row decoder comprises a switching unit configured to connect the at least two wordlines to the at least two memory cells in response to a low power mode enable signal.

6. The semiconductor memory device of claim 5, wherein the row decoder enables the at least two wordlines in response to a second row address where the low power mode enable signal is activated, and wherein the second row address includes one fewer bit than a first row address used in the normal power mode.

7. The semiconductor memory device of claim 6, wherein the row decoder further comprises an address conversion unit configured to convert the first row address to the second row address.

8. The semiconductor memory device of claim 1, wherein the selection circuit comprises a row decoder and a column decoder, and the column decoder concurrently enables at least two bitlines and assigns the one data address to the at least two memory cells in the low power mode.

9. The semiconductor memory device of claim 1, wherein the selection circuit comprises a row decoder and a column decoder, the row decoder concurrently enables at least two wordlines, and the column decoder concurrently enables at least two bitlines such that the row decoder and the column decoder assigns the one data address to at least four memory cells in the low power mode.

10. The semiconductor memory device of claim 1, wherein the semiconductor memory device initializes the memory cells where an operating mode of the semiconductor memory device transitions from the normal power mode to the low power mode or transitions from the low power mode to the normal power mode.

11. The semiconductor memory device of claim 1, wherein the semiconductor memory device backs up the data stored in the memory cell array to an external storage device before initializing the memory cells, and writes the data backed up in the external storage device in the memory cell array after initializing the memory cells.

12. A semiconductor memory device having a normal power mode and a low power mode, wherein the semiconductor memory device is provided with lower level of operating voltage in the low power mode than in the normal power mode, the semiconductor memory device comprising:
- a memory cell array comprising a plurality of memory cells;
- a row decoder configured to enable first address lines corresponding to row addresses of the memory cells;
- a column decoder configured to enable second address lines corresponding to column addresses of the memory cells; and
- a sense amplifier unit configured to read data stored in the memory cells,
- wherein at least one of the row decoder and the column decoder enables at least two address lines of the first and second address lines and assigns one data address to at least two memory cells of the memory cells in the low power mode,
- wherein a same data is written in the at least two memory cells to which the one data address is assigned in a write operation of the low power mode.

13. The semiconductor memory device of claim 12, wherein the sense amplifier unit comprises a plurality of sense amplifiers, and one of the sense amplifiers reads data written in the at least two memory cells in a read operation of the low power mode.

14. A method of operating a semiconductor memory device having a low power mode and a normal power mode, comprising:
- in the low power mode, assigning a first data address to at least two memory cells and storing a first bit of data in each of the at least two memory cells; and
- in the normal power mode, assigning a second data address to only one memory cell and storing a second bit of data in the only one memory cell,
- wherein a same data is written in the at least two memory cells to which the first data address is assigned in a write operation of the low power mode.

15. The method of claim 14, wherein the semiconductor memory device is a static random access memory (SRAM).

16. The method of claim 14, further comprising initializing a memory array of the semiconductor memory device upon switching into the low power mode.

17. The method of claim 14, wherein the at least two memory cells are connected to the same wordline.

18. The method of claim 14, wherein the at least two memory cells are connected to the same bitline.

19. The method of claim 14, wherein the at least two memory cells comprise four memory cells.

* * * * *